US006740799B1

(12) United States Patent
Liao

(10) Patent No.: US 6,740,799 B1
(45) Date of Patent: May 25, 2004

(54) CENTRAL BAR STRUCTURE FOR HI-HAT CYMBALS

(76) Inventor: Tsun-Chi Liao, 1F, No. 7, Lane 545, Sec. 2, Chun-Kung Rd., Taichung City (TW)

(*) Notice: Subject to any disclaimer, the term of this patent is extended or adjusted under 35 U.S.C. 154(b) by 0 days.

(21) Appl. No.: 10/370,724

(22) Filed: Feb. 24, 2003

(51) Int. Cl.[7] ................................................ H10D 13/02

(52) U.S. Cl. ..................... 84/422.3; 84/422.1; 84/422.2

(58) Field of Search ............................ 84/422.1, 422.2, 84/422.3, 421

(56) References Cited

U.S. PATENT DOCUMENTS 4,381,690 A * 5/1983 Kimble ...................... 84/422.3
4,510,838 A * 4/1985 Alexis, Jr. ................. 84/422.3
5,052,262 A * 10/1991 Havens ........................ 84/421
6,075,192 A * 6/2000 Hoshino .................... 84/422.3

* cited by examiner

*Primary Examiner*—Kimberly Lockett
(74) *Attorney, Agent, or Firm*—Birch, Stewart, Kolasch & Birch, LLP

(57) ABSTRACT

A central bar structure for hi-hat cymbals includes a central bar running through an upright tube of a cymbal stand. The central bar has a top end fastening to an upper cymbal and a lower end connecting to a foot pedal such that when the foot pedal is depressed the upper cymbal is moved downwards to strike a lower cymbal to generate sound. The lower end of the central bar further connects to a flexible toggle linkage unit. The toggle linkage unit has a bottom end housing a bearing to pivotally couple with an axle rod of the foot pedal. Thus the central bar may be moved smoothly without resistance when the foot pedal is depressed.

5 Claims, 6 Drawing Sheets

CENTRAL BAR STRUCTURE FOR HI-HAT CYMBALS

FIELD OF THE INVENTION

The present invention relates to a central bar structure for hi-hat cymbals and particularly a structure that has a toggle linkage unit bridging the lower end of a central bar and a foot pedal to smooth the descending movement of the central bar to enable the upper cymbal to strike the lower cymbal to generate sound.

BACKGROUND OF THE INVENTION

A conventional hi-hat cymbal stand such as the one shown in FIGS. 1 and 2 mainly includes a tripod stand 1 with an upright tube 2 in the center. There is a central bar 3 running through the interior of the upright tube 2. The central bar 3 has a top end fastening to an upper cymbal 4 and a bottom end connecting to a foot pedal 5. There is a lower cymbal 6 fastening to the top end of the upright tube 2. When the foot pedal 5 is depressed, the upper cymbal 4 is moved downwards to strike the lower cymbal 6 to generate sound. As the foot pedal 5 is mounted in a biased manner and forms an angle with the upright tube 2, when the foot pedal 5 is depressed, the central bar 3 is pulled downwards to generate a reaction force and leans towards the foot pedal 5. Since the upright tube 2 is fixed and stationary, the central bar 3 slides inside the upright tube 2 and a resistant force occurs due to the interference taking place between the central bar 3 and the inner wall of the upright tube 2. To remedy this problem, conventional techniques mostly have a chain 7 pivotally connecting to the foot pedal 5. The chain 7 has flexibility to eliminate the interference and resistance occurred to the central bar 3.

As the chain 7 usually consists of a plurality of connecting segments, it does not have desired precision and sensitivity to transmit forces. But the hi-hat cymbal has to match performer's desire to produce fast and precise beats to generate the optimal audio effect. The chain 7 cannot fully meet such a requirement. There is still room for improvement.

SUMMARY OF THE INVENTION

Therefore the primary object of the invention is to provide a central bar structure for hi-hat cymbals that has a toggle linkage unit bridging the lower end of the central bar and the foot pedal. The toggle linkage unit is flexible. Thus when the foot pedal is depressed, the angle between the central bar and the foot pedal may be narrowed and closed without resistance. The toggle linkage unit further has a bearing located on the bottom to couple with an axle rod of the foot pedal for the foot pedal to operate smoothly.

The foregoing, as well as additional objects, features and advantages of the invention will be more readily apparent from the following detailed description, which proceeds with reference to the accompanying drawings.

DESCRIPTION OF THE PREFERRED EMBODIMENT

Figure 1:
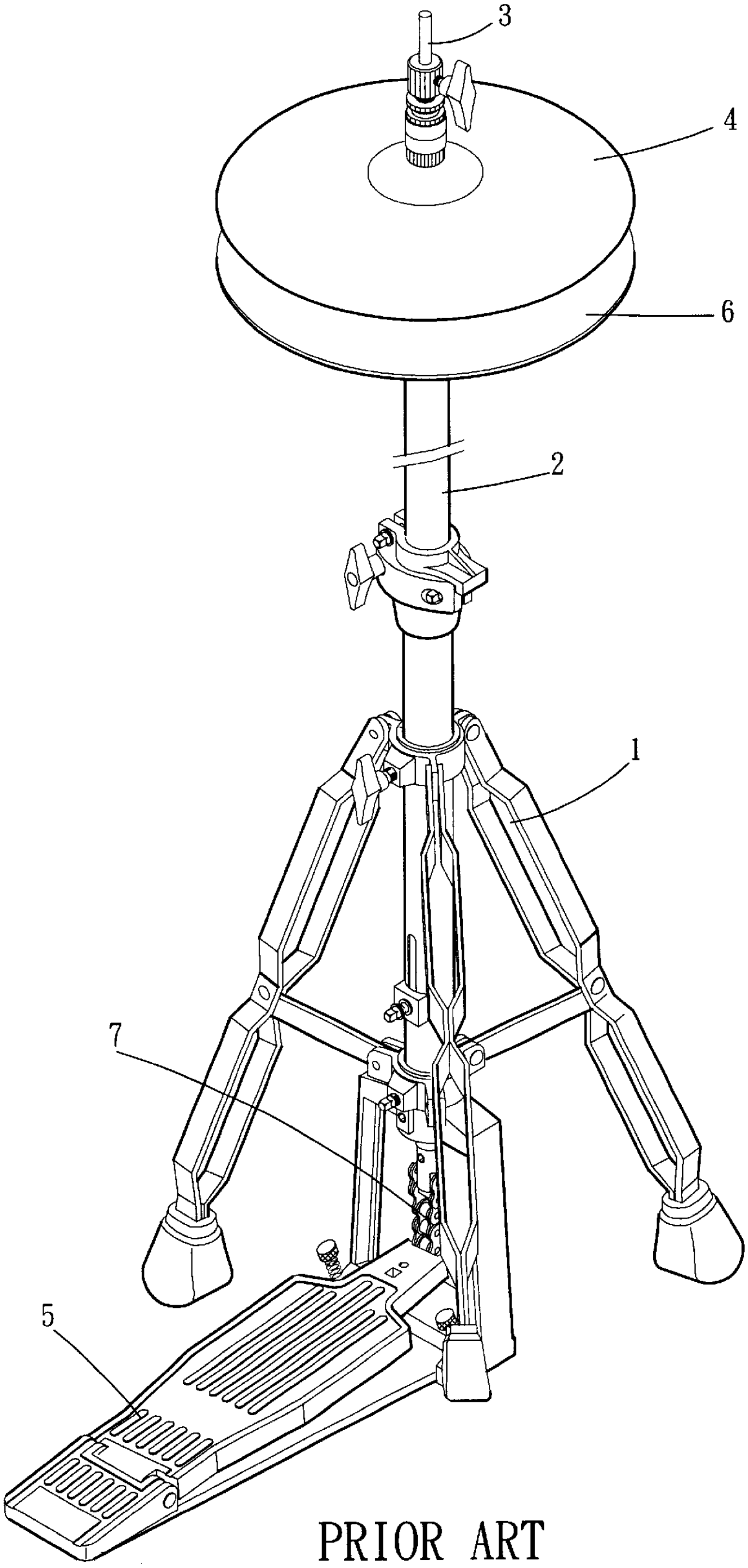
PRIOR ART FIG. 1
FIG. 1 is a perspective view of a conventional hi-hat cymbal stand.
Figure 2:
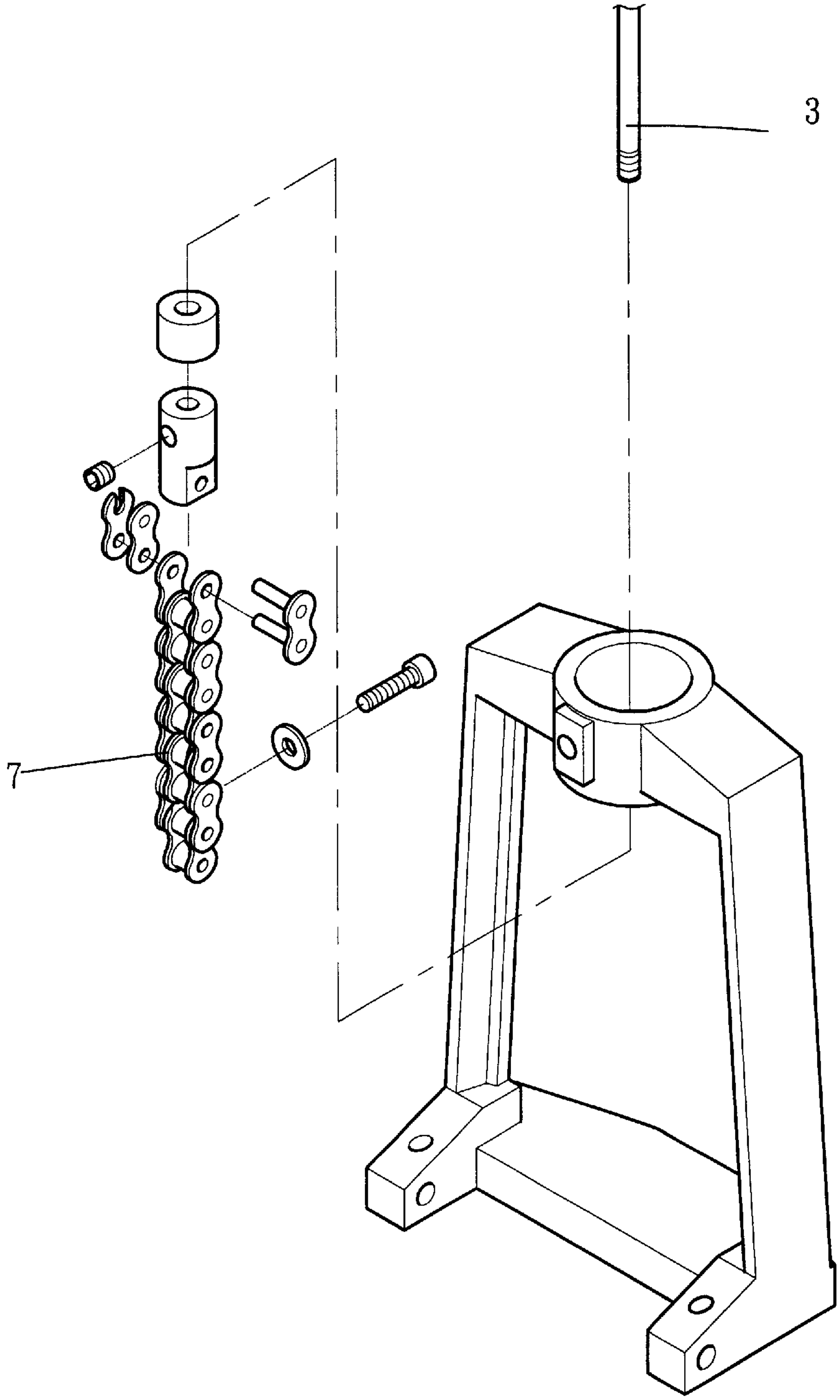
PRIOR ART FIG. 2
FIG. 2 is a fragmentary exploded view of a conventional hi-hat cymbal stand.
Figure 3:
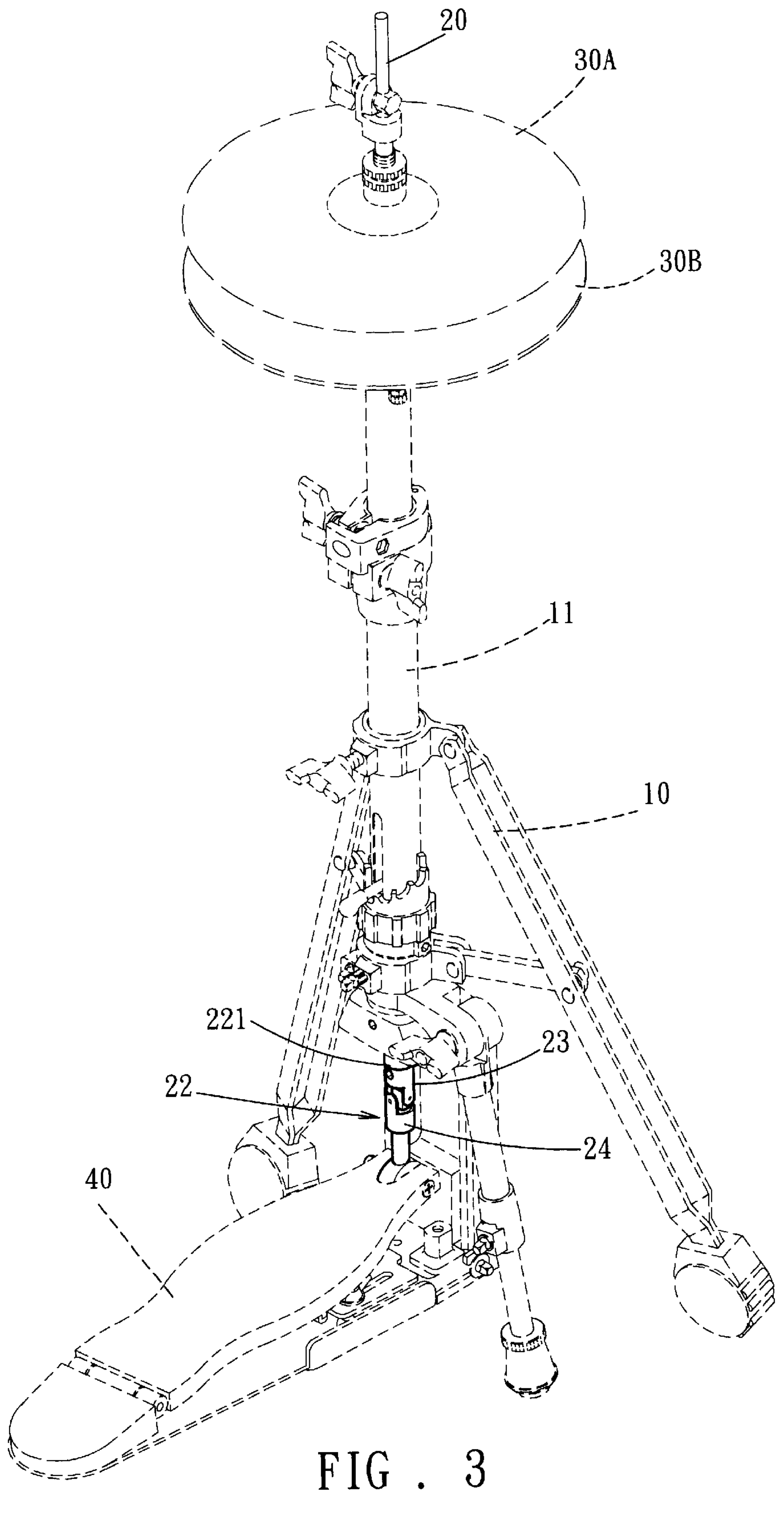
FIG. 3 is a perspective view of an embodiment of the invention coupling with a hi-hat cymbal stand.
Figure 4:
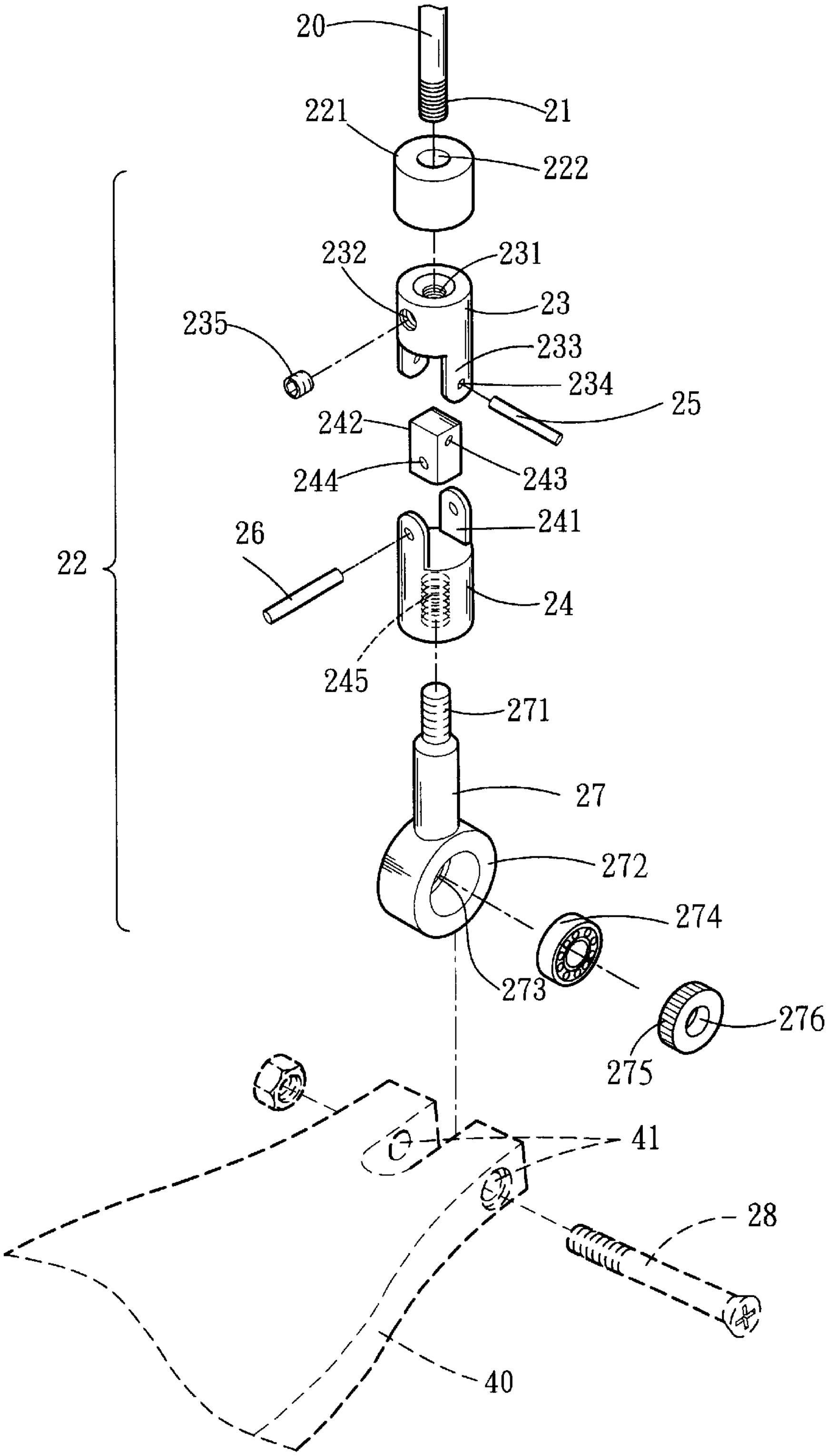
FIG. 4 is an exploded view of an embodiment of the invention.

Referring to FIGS. 3 and 4, the central bar structure of a hi-hat cymbal according to the invention includes a central bar 20 running through the interior of an upright tube 11 of a hi-hat cymbal stand 10, a toggle linkage unit 22, an upper toggle joint 23, a lower toggle joint 24, a first pin 25, a second pin 26, a pivotal connection element 27 and an axle rod 28. The central bar 20 has a top end fastening to an upper cymbal 30A and a lower end connecting to a foot pedal 40. There is a lower cymbal 30B fastening to the upright tube 11. When the foot pedal 40 is depressed, the central bar 20 is pulled downwards to enable the upper cymbal 30A to strike the lower cymbal 30B to generate sound. There is a bolt 21 located on the lower end of the central bar 20.

The toggle linkage unit 22 includes a buffer pad 221 which has an opening 222 in the center to allow the bolt 21 to run through.

The upper toggle joint 23 is formed substantially in a barrel shape and located under the buffer pad 221. It has a first screw hole 231 in the center of the top end to engage with the bolt 21 and a second screw hole 232 formed transversely on the peripheral wall. The upper toggle joint 23 further has a pair of opposing upper lugs 233 on a lower side. Each upper lug 233 has an aperture 234. The second screw hole 232 is engaged with a set screw 235.

The lower toggle joint 24 is formed substantially in a barrel shape and located under the upper toggle joint 23. It has a pair of opposing lower lugs 241 extending upwards from the top end thereof. Each lower lug 241 has an aperture. There is a pivotal connection member 242 located between the lower lugs 241. The pivotal connection member 242 has a first pivotal hole 243 transversely crossing thereof and a second pivotal hole 244 crossing thereof. The lower toggle joint 24 further has a screw hole 245 formed on the bottom end.

The first pin 25 runs through the apertures 234 of the upper lugs 233 of the upper toggle joint 23 and the first pivotal hole 243 of the pivotal connection member 242 of the lower toggle joint 24.

The second pin 26 runs through the lower lugs 241 of the lower toggle joint 24 and the second pivotal hole 244 of the pivotal connection member 242.

The pivotal connection element 27 is fastened to the bottom end of the lower toggle joint 24. It has a bolt 271 located on the top end and forms an annular ring 272 on the bottom end. The annular ring 272 has a transverse axle hole 273 to house a bearing 274. There is a sealing cap 275 sealing the axle hole 273 from outside. The sealing cap 275 has an opening 276.

The axle rod 28 runs through two through holes 41 on two sides of the foot pedal 40, and the opening 276 of the sealing cap 275 and the center of the bearing 274 to couple them together.

Figure 5A:
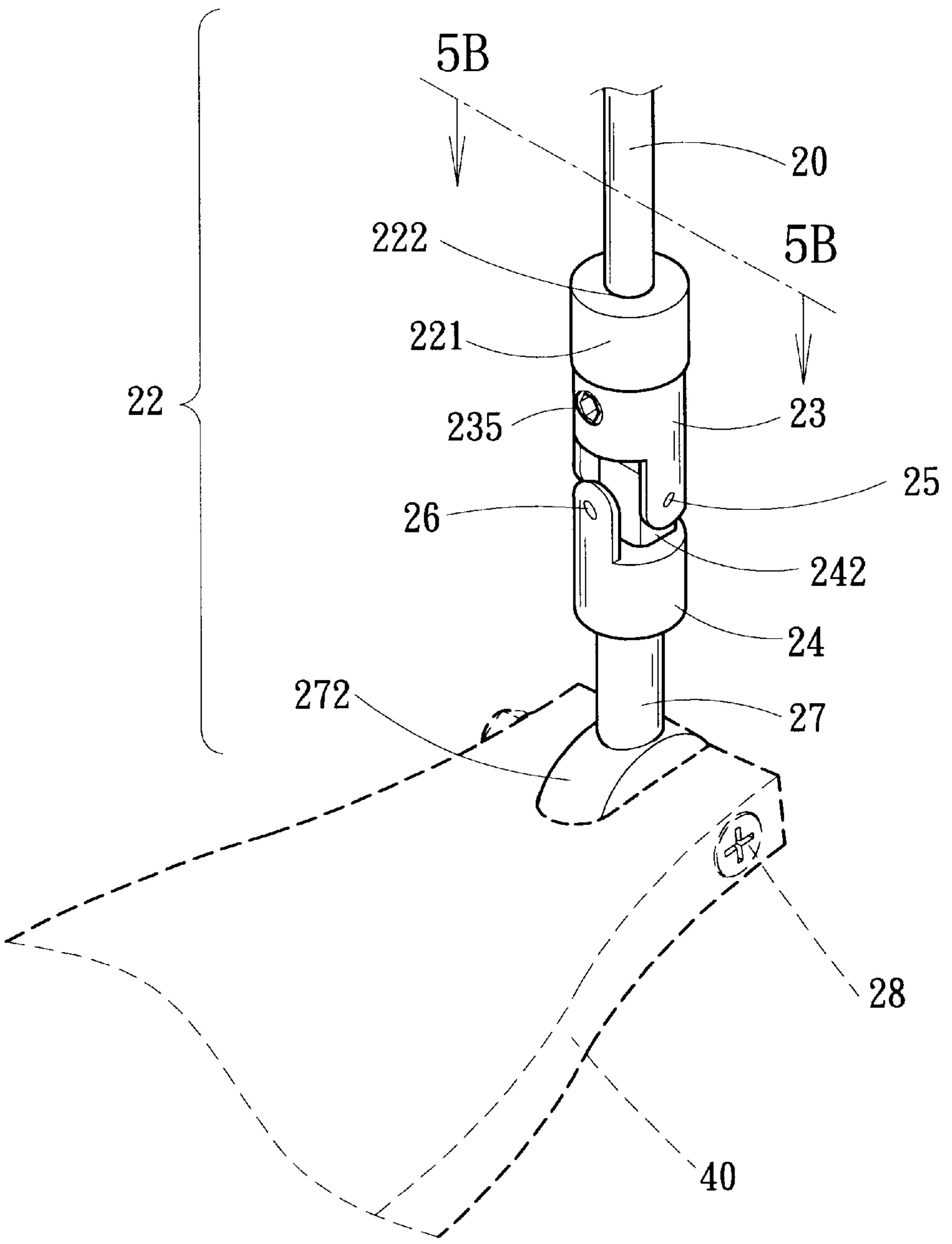
FIG. 5A is a perspective view of an embodiment of the invention.
Figure 5B:
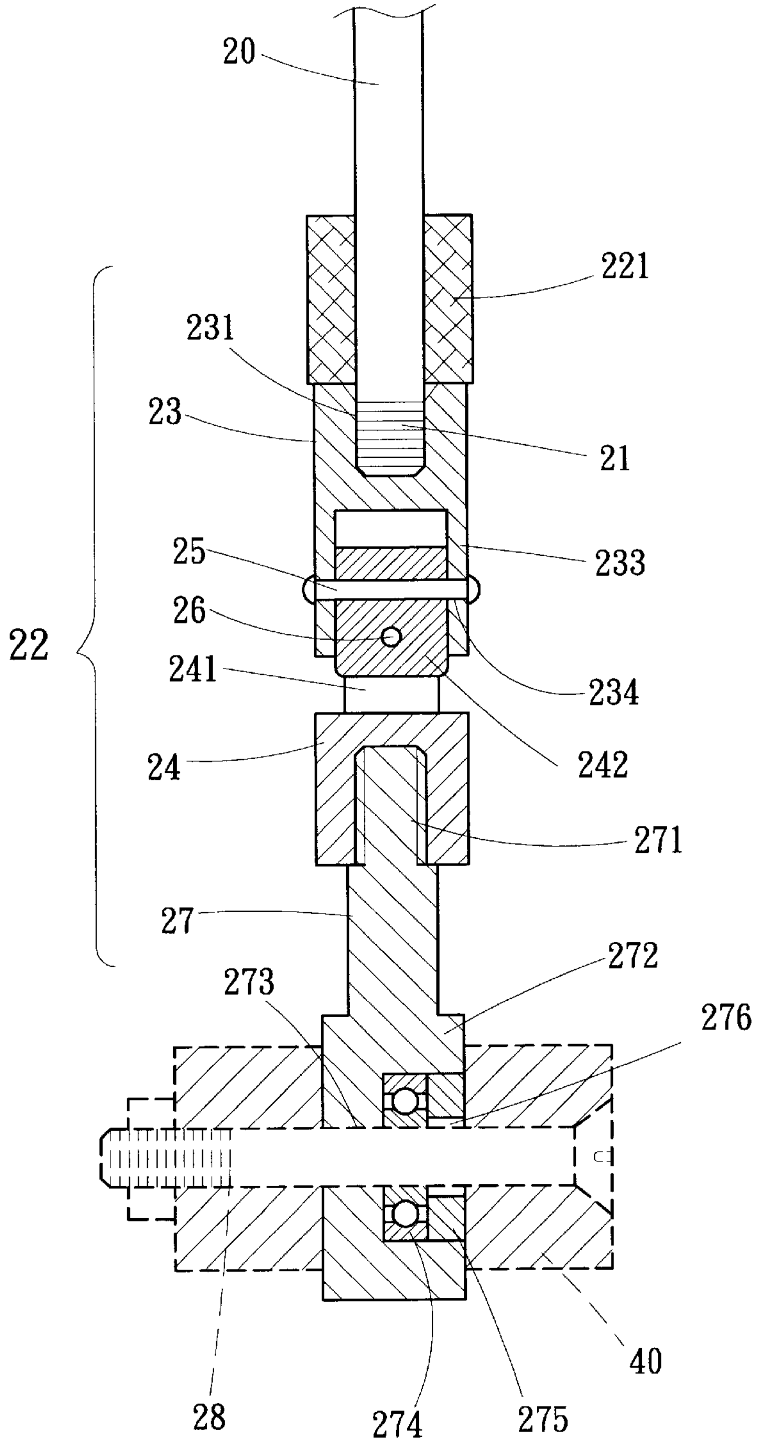
FIG. 5B is a cross section taken on line 5B—5B in FIG. 5A.

Referring to FIGS. 5A and 5B, by means of the construction set forth above, when the foot pedal 40 is depressed, the central bar 20 is pulled downwards. As the foot pedal 40 is mounted in a biased manner, when depressed, the angle between the foot pedal 40 and the central bar 20 becomes smaller. The pivotal connection element 27 at the bottom end of the central bar 20 swivels about the axle rod 28 and turns slightly towards the foot pedal 40. Because of the bearing 274 is interposed between the axle rod 28 and the annular ring 272 of the pivotal connection element 27, the pivotal connection element 27 may be swiveled with adequate lubrication. Therefore the foot pedal may be moved and operated smoothly.

In addition, as the central bar 20 runs thought the interior of the upright tube 11 of the cymbal stand 10, when the foot pedal 40 is depressed and the central bar 20 is pulled downwards and moved towards the foot pedal 40, the central bar 20 is constrained by the inner wall of the upright tube 11 and can move only downwards inside the upright tube 11. Because the lower end of the central bar 20 is fastened to the upper toggle joint 23 and the lower toggle joint 24 that are movable flexibly forwards and rearwards, when the foot pedal 40 is depressed, the lower toggle joint 24 is moved and closed to the foot pedal 40. The central bar 20 connecting to the upper toggle joint 23 is moved axially in the upright tube 11. Thus through the flexible and pivotal connection of the upper toggle joint 23 and the lower toggle joint 24, the central bar 20 may be moved downwards without experiencing resistance. The movement is smooth and sensitive.

What is claimed is:

1. A central bar structure for hi-hat cymbals comprising a central bar which runs through an upright tube of a cymbal stand and has a top end fastening to an upper cymbal and a lower end connecting to a foot pedal such that when the foot pedal is depressed the upper cymbal is moved downwards to strike a lower cymbal located on the cymbal stand to generate sound; wherein the lower end of the central bar connects to a toggle linkage unit which includes an upper toggle joint and a lower toggle joint pivotally engaged with the upper toggle joint, the lower toggle joint being pivotally engaged with the foot pedal in a transverse manner to facilitate downward movement of the central bar when the foot pedal is depressed wherein the lower the lower toggle joint has a bottom end fastening to a pivotal connection element, the pivotal connection element having a bottom end forming an axle hole to house a bearing to allow an axle rod to run through, the axle rod also running through the two through holes formed on the left side and the right side of the foot pedal to couple the bearing with the foot pedal.

2. The central bar structure for hi-hat cymbals of claim 1, wherein the upper toggle joint has a top end forming a first screw hole and a buffer pad located thereon, the buffer pad having a center opening to allow a bolt formed on the bottom end of the central bar to run though and fasten to the first screw hole of the upper toggle joint.

3. The central bar structure for hi-hat cymbals of claim 2, wherein the upper toggle joint has a second screw hole formed on the peripheral surface thereof to engage with a set screw to fasten the central bar.

4. The central bar structure for hi-hat cymbals of claim 1, wherein the upper toggle joint and the lower toggle joint are interposed by a pivotal connecting member which has a first pivotal hole, the upper toggle joint having a pair of upper lugs located on a left side and a right side, the upper lugs having respectively an aperture to receive a first pin to engage with the first pivotal hole of the pivotal connecting member.

5. The central bar structure for hi-hat cymbals of claim 4, wherein the pivotal connecting member having a second pivotal hole formed, the lower toggle joint having a top end which has a pair of lower lugs with an aperture formed respectively thereon to receive a second pin to engage with the second pivotal hole.

* * * * *